(12) United States Patent
Bains et al.

(10) Patent No.: US 8,484,410 B2
(45) Date of Patent: Jul. 9, 2013

(54) METHOD TO STAGGER SELF REFRESHES

(75) Inventors: Kuljit S. Bains, Olympia, WA (US);
George Vergis, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 474 days.

(21) Appl. No.: 12/758,667

(22) Filed: Apr. 12, 2010

(65) Prior Publication Data
US 2011/0252193 A1 Oct. 13, 2011

(51) Int. Cl.
*G06F 12/00* (2006.01)
*G06F 13/00* (2006.01)
*G06F 13/28* (2006.01)

(52) U.S. Cl.
USPC ............. 711/106; 711/105; 711/E12.001

(58) Field of Classification Search
USPC .................. 711/106, 105, E12.001
See application file for complete search history.

(56) References Cited

U.S. PATENT DOCUMENTS

| | | | |
|---|---|---|---|
| 5,365,487 A | 11/1994 | Patel et al. | |
| 5,793,776 A | 8/1998 | Qureshi et al. | |
| 6,226,709 B1 | 5/2001 | Goodwin et al. | |
| 6,311,250 B1 * | 10/2001 | Kishino | 711/106 |
| 6,788,606 B2 | 9/2004 | Fibranz et al. | |
| 7,482,856 B2 | 1/2009 | Lee | |
| 7,894,627 B2 | 2/2011 | Lang et al. | |
| 2002/0042902 A1 * | 4/2002 | Yamamoto et al. | 716/1 |
| 2002/0141267 A1 | 10/2002 | Choi | |
| 2002/0191467 A1 | 12/2002 | Matsumoto et al. | |
| 2002/0191480 A1 | 12/2002 | Matsumoto et al. | |
| 2003/0182493 A1 | 9/2003 | Frame et al. | |
| 2004/0078611 A1 | 4/2004 | Hoehler | |
| 2006/0104139 A1 | 5/2006 | Hur et al. | |
| 2006/0221748 A1 * | 10/2006 | Kinsley et al. | 365/222 |
| 2006/0259804 A1 | 11/2006 | Fry | |
| 2007/0007992 A1 * | 1/2007 | Bains et al. | 326/30 |
| 2007/0061614 A1 * | 3/2007 | Choi | 714/6 |
| 2007/0106838 A1 * | 5/2007 | Choi | 711/106 |
| 2007/0162689 A1 * | 7/2007 | Choi | 711/105 |
| 2008/0028137 A1 | 1/2008 | Schakel et al. | |
| 2009/0164846 A1 * | 6/2009 | Foster et al. | 714/30 |
| 2010/0174955 A1 * | 7/2010 | Carnevale et al. | 714/718 |

(Continued)

FOREIGN PATENT DOCUMENTS

| | | |
|---|---|---|
| DE | 103 41 556 | 6/2004 |
| JP | 5314766 | 11/1993 |
| WO | WO-98/25271 | 6/1998 |

OTHER PUBLICATIONS

U.S. Appl. No. 12/752,918, Bains, Kuljit.

(Continued)

*Primary Examiner* — Sheng-Jen Tsai
(74) *Attorney, Agent, or Firm* — Blakely, Sokoloff, Taylor & Zafman LLP

(57) ABSTRACT

A system, device, and method for designating a first rank among a plurality of memory ranks of a Memory Module as a primary rank and a second one or more ranks as secondary ranks, triggering, via hardware logic internal to the Memory Module coupled with the plurality of memory ranks, a refresh of the primary rank at a first time (e.g., $Time_1$), and triggering a non overlapping staggered refresh of each of the secondary ranks at a second one or more times (e.g., $Time_2$ through $Time_n$) corresponding to each of the respective memory ranks designated as the secondary ranks.

23 Claims, 7 Drawing Sheets

U.S. PATENT DOCUMENTS

| | | | | |
|---|---|---|---|---|
| 2011/0101938 A1* | 5/2011 | Ma et al. | | 323/282 |
| 2011/0131432 A1* | 6/2011 | Berke et al. | | 713/320 |
| 2011/0179221 A1* | 7/2011 | Pax | | 711/105 |
| 2012/0147684 A1* | 6/2012 | Schakel et al. | | 365/194 |

OTHER PUBLICATIONS

Actel Corporation, "Termination of the Vpp and Mode Pin for RH1020 and RH1280 Devices in a Radiation Environment", Oct. 2001, 4 pages.

Pending U.S. Appl. No. 12/752,918, filed on Apr. 1, 2010 23 pages.

Office Action from Application No. 1104300.7 mailed Jun. 24, 2011, 5 pages.

Office Action from U.S. Appl. No. 12/752,918 mailed May 31, 2012, 19 pages.

Office Action from Application No. GB1104300.7 mailed Jul. 20, 2012, 5 pages.

Office Action from Application No. 10 2011 014 587.7 mailed Jul. 2, 2012, 7 pages.

Office Action from Application No. 10-2011-29390 mailed Aug. 21, 2012, 3 pages.

Office Action for Application No. 1106129.8 dated Jul. 28, 2011, 7 pages.

Office Action for Application No. 10-2011-33902 dated Sep. 11, 2012, 8 pages.

* cited by examiner

425 - Peak Power Requirement = $\sum(Rank_0 + Rank_1 + Rank_2 + Rank_3 + Rank_4 + Rank_5 + Rank_6 + Rank_7)$ 430 - Average Power Requirement = $\sum(Rank_0 + Rank_1 + Rank_2 + Rank_3 + Rank_4 + Rank_5 + Rank_6 + Rank_7) \div n\_ranks$

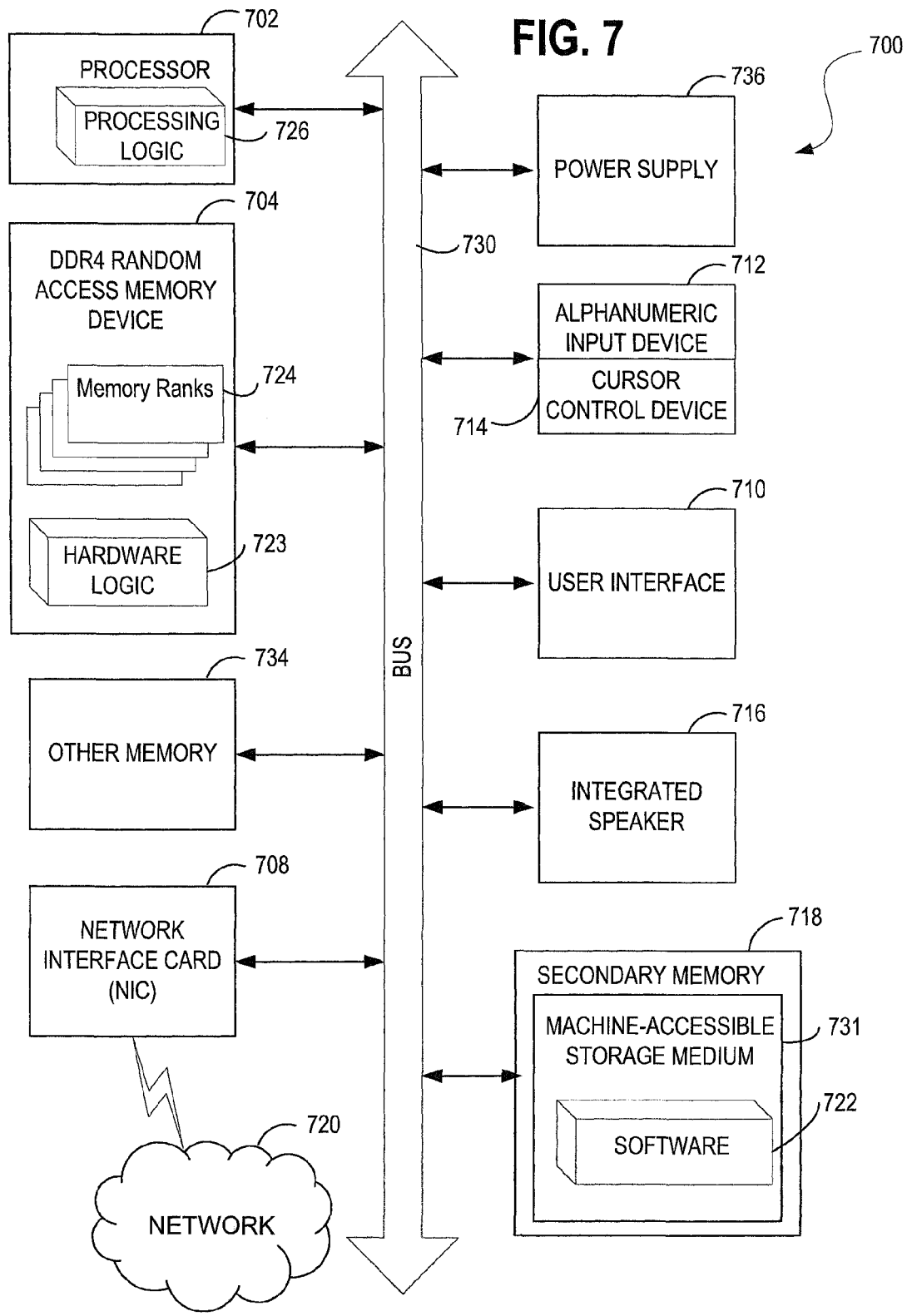

METHOD TO STAGGER SELF REFRESHES

TECHNICAL FIELD

Embodiments of the invention relate to the field of computing, and more particularly, to a memory self refresh mechanism to reduce a peak power requirement of such a memory.

BACKGROUND

Memory "refreshes" are the mechanism by which data stored in a Dynamic Random Access Memory (DRAM) is kept alive so that the data stored in the memory does not either degrade or become completely lost. For example, when a conventional computer system is completely shut down and all power is removed, all the data stored in a Memory Module for the computer will eventually become totally useless and irrecoverable. Other Memory Modules that are based on SRAMs do not require refreshes.

Memory refreshes are commonly initiated by an external device, such as a "memory controller" interacting with the memory, in which the memory controller refreshes a portion of the Memory Module as part of, or prior to conducting an operation on the Memory Module, such as a read or write operation. While in active use, a memory controller will also persist with memory "refreshes" as appropriate, so that data stored in the memory does not degrade. When the memory's refreshes are under the control of an external device, such as a memory controller, the memory device simply responds accordingly to directives received from the external device/external memory controller (e.g., the memory will refresh an appropriate portion when directed externally).

A second type of memory "refresh" occurs with such Memory Modules, besides an external refresh or an externally triggered refresh. For example, conventional Memory Modules support a "self refresh" mechanism, in which the refreshes are not initiated by an external device, such as the above memory controller, but rather, such memory refreshes are triggered internally by the Memory Module itself, causing a refresh operation, for example, on each row or rank of the memory in an iterative fashion, over all rows or ranks within the memory.

Memory "self refreshes" are used, for example, when a Memory Module is placed into a low power mode, such as when the memory is not actively being utilized, but the contents of the memory must nevertheless be maintained in an accurate state.

When an external memory controller is managing the memory "refreshes," the controller itself ensures that the refreshes are timed and staggered appropriately through processing power and appropriate instructions available to the memory controller. However, if a Memory Module is internally iterating through a indefinite period of "self-refresh" (for example, entering a self refresh mode until awoken by an external memory controller at an unknown time in the future), then the Memory Module must itself ensure that all memory rows or ranks are refreshed at a repeating time interval appropriately calculated to ensure that data stored within the memory or Memory Module is not lost, without aid or instruction from the external controller.

BRIEF DESCRIPTION OF THE DRAWINGS

Embodiments of the present invention are illustrated by way of example, and not by way of limitation, and can be more fully understood with reference to the following detailed description when considered in connection with the figures in which:

FIG. 7 illustrates a diagrammatic representation of a machine in the exemplary form of a computer system, in accordance with one embodiment of the present invention.

DETAILED DESCRIPTION

Figure 1:
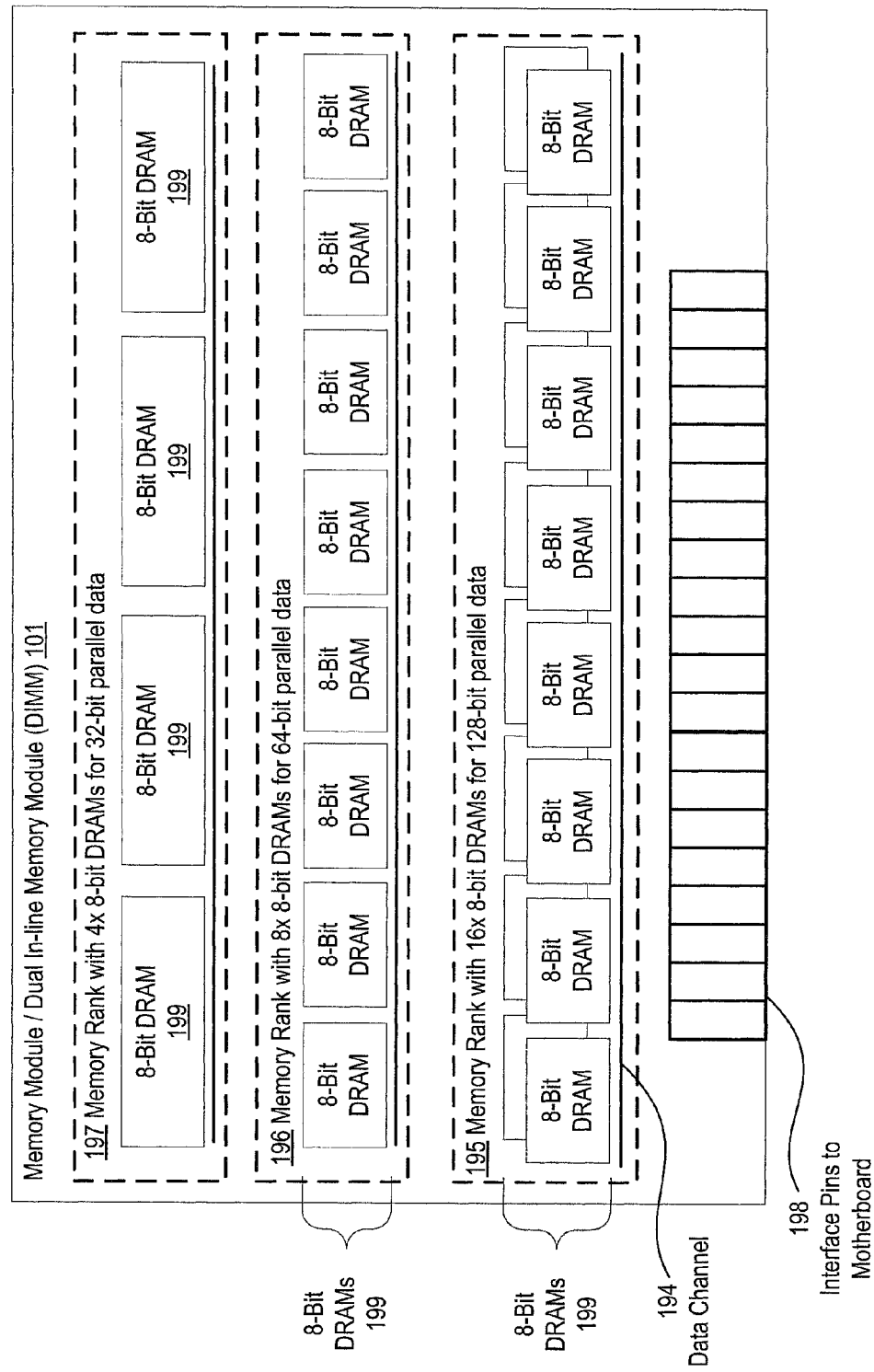
FIG. 1 illustrates an exemplary architecture in which embodiments of the present invention may operate.

Described herein are systems, devices, and methods for designating a first rank among a plurality of memory ranks of a Memory Module or DIMM as a primary rank within the Memory Module or DIMM, designating a second one or more ranks among the remaining plurality of memory ranks of the Memory Module as secondary ranks, triggering, via hardware logic internal to the Memory Module, a refresh of the primary rank at a first time (e.g., $Time_1$), and triggering, via the hardware logic internal to the Memory Module, a non overlapping staggered refresh of each of the remaining plurality of memory ranks designated as the secondary ranks at a second one or more times (e.g., $Time_2$ through $Time_n$) corresponding to each of the respective memory ranks designated as the secondary ranks.

In a particular embodiment, the first time, and the second one or more times (e.g., $Time_2$ through $Time_n$) are based on a value stored within a Mode Register which is internal to the Memory Module itself. In some embodiments, a mode register stores a value representing the time period at which a particular rank may start its refresh, such as after a period of delay. In alternative embodiments, the Mode Register stores a Rank Identifier for a particular memory rank and a time or a delay period is computed or derived by the Memory Module based on the identity of the particular rank (e.g., the fourth rank may be computed by multiplying a base by the rank's identifier by dividing the rank or a total number of ranks into a larger value to derive a time that comports with the non-overlapping staggered refresh scheme). Such details are described in additional detail below in reference to the detailed Figures accompanying the specification.

Certain functionality described herein may be performed by hardware logic which is internal to the Memory Module itself, or via firmware applied to such a device if supported. The Memory Module described herein may be installed into other components or integrated into a system, or may be installed directly into a system subsequent to manufacture of the system. To be very clear however, the Memory Module which is capable of carrying out its described functions is claimed separately, may be manufactured and sold separately, or may alternatively be integrated into a system at manufacture and sold with such a system, such as that which is also claimed herein.

In the following description, numerous specific details are set forth such as examples of specific systems, languages, components, etc., in order to provide a thorough understanding of the various embodiments of the present invention. It will be apparent, however, to one skilled in the art that these specific details need not be employed to practice the disclosed embodiments of the present invention. In other instances, well known materials or methods have not been described in detail in order to avoid unnecessarily obscuring the disclosed embodiments.

In addition to various hardware components depicted in the figures and described herein, embodiments of the present invention further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Embodiments of the present invention also relate to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, embodiments of the present invention are not described with reference to any particular programming language. It will be appreciated that a variety of programming languages may be used to implement the teachings of the embodiments as described herein.

Embodiments of the present invention may be provided as a computer program product, or software, that may include a machine-readable medium having stored thereon instructions, which may be used to program a computer system (or other electronic devices) to perform a process according to the disclosed embodiments. A machine-readable medium includes any mechanism for storing or transmitting information in a form readable by a machine (e.g., a computer). For example, a computer-readable medium (e.g., non-transitory computer-readable storage medium) includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical), etc.

FIG. 1 illustrates an exemplary architecture 100 in which embodiments of the present invention may operate. Architecture 100 depicts a Memory Module or a Dual In-Line Memory Module (DIMM) 101 which depicts a device having three distinct memory ranks 195 through 197 each with multiple Dynamic Random Access Memories (DRAMs) 199. For the sake of illustration, multiple configurations of memory ranks 195 through 197 are depicted, although more likely, each of the ranks would likely have a similar configuration within a particular DIMM 101. In the depicted embodiment, memory rank 197 includes four 8-bit DRAMs which provide a 32-bit parallel data channel for read and write operations. Memory rank includes eight 8-bit DRAMs which provide a 64-bit parallel data channel for read and write operations. Finally, memory rank 195 includes sixteen 8-bit DRAMs which provide a 128-bit parallel data channel 194 for read and write operations. The memory ranks 195 through 197 within DIMM 101 share a common set of address and command signals but may have dedicated control signals and provide data in parallel via DIMM 101. Interface pins 198 are further depicted allowing the DIMM 101 to connect to, for example, a motherboard or to another external interface.

Figure 2:
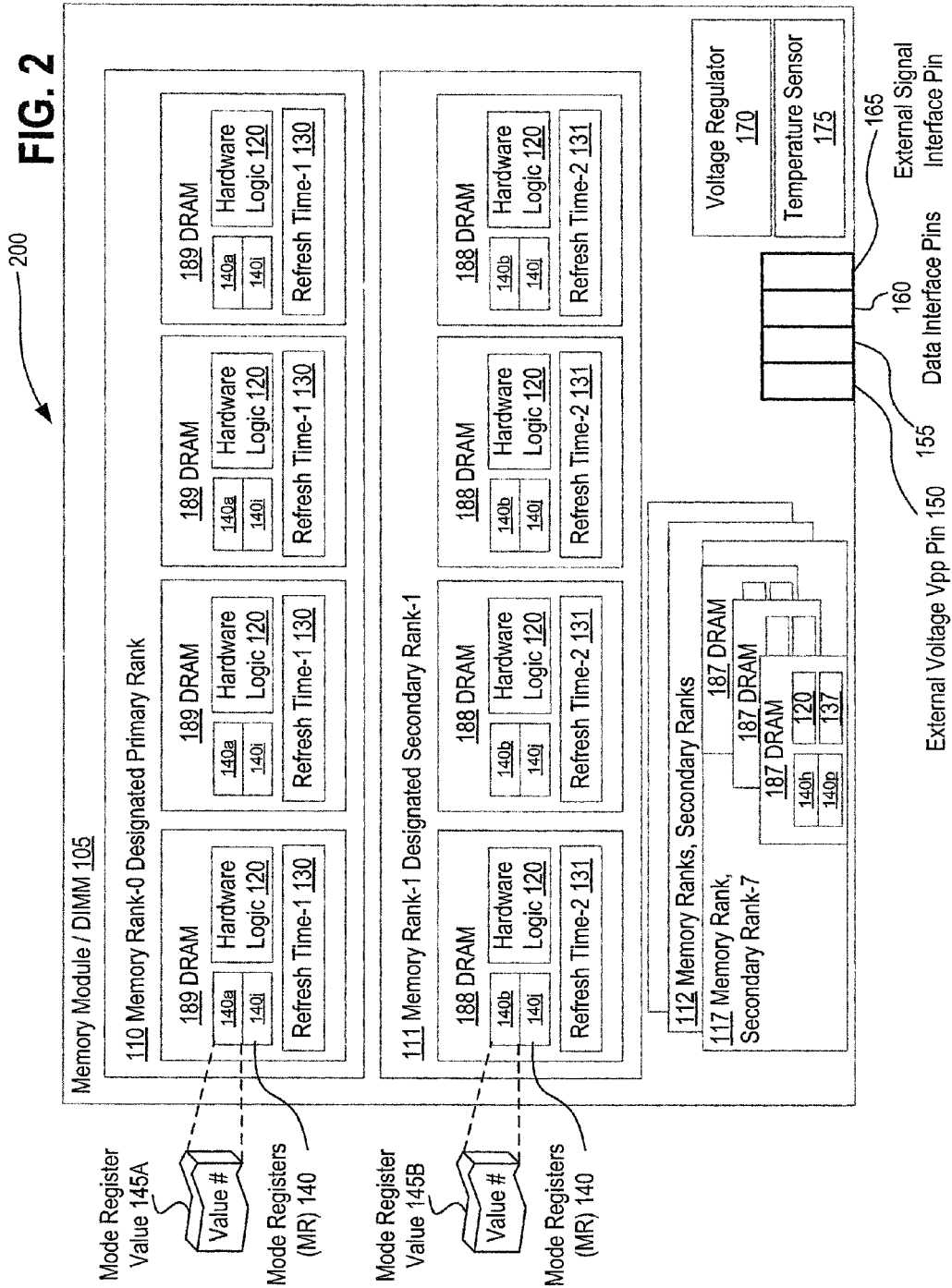
FIG. 2 illustrates an alternative exemplary architecture in which embodiments of the present invention may operate.

FIG. 2 illustrates an alternative exemplary architecture 200 in which embodiments of the present invention may operate. Architecture 100 includes a Memory Module 105 which in turn includes multiple memory ranks 110 through 117. As depicted, memory rank 110 is identified as memory rank "0" and is designated as a primary rank. The remainder of memory ranks 111 through 117 depicted in this embodiment are identified as memory ranks "1" through "7" and are all designated as "secondary ranks," ranging from secondary rank "1" through secondary rank "7."

Although the embodiment set forth in FIG. 2 depicts memory ranks 110 through 117 with rank "0" at element 110 designated as "primary" and the remaining ranks 111 through 117 each designated as "secondary" ranks, these quantities are simply for purposes of illustration. Only one secondary rank is required, and thus two total "ranks" within a particular memory module 105 in accordance with embodiments of the invention. For example, in one embodiment, a Memory Module includes only 2 ranks total, in which one rank is designated as a "primary," and the remaining ranks, in this embodiment, the only remaining rank, is designated as "secondary." In an alternative embodiment, a Memory Module may have four total ranks, six ranks, or sixteen ranks, etc. The mechanism described herein are applicable to each such structure.

Memory Module 105 further includes hardware logic 120 within each DRAM device which, as depicted, is integral to, internal to, or integrated within the DRAM memory, and the DRAM memories are then themselves integrated within Memory Module 105 itself. Thus, as depicted, Memory rank 110 is identified as "rank 0" and is designated as a "primary rank," in which the memory rank 110 includes four distinct DRAM memories 189, each having integrated hardware logic 120. Each DRAM 189 of memory rank 110 further includes Mode Registers 140 (140*a* and 140*i* are depicted within each of the DRAM 189 memories), and each DRAM 189 of memory rank 110 further includes a refresh time-1 130 which is similarly integrated into the DRAM memory itself, within memory rank 110.

The structure for the secondary ranks repeats with memory ranks 111 having been labeled as memory rank-1 and designated as secondary rank-1 in which four DRAM memories 188 are again depicted, each DRAM memory 188 having its own integrated hardware logic 120, refresh time-2 131, and mode registers 140 (each DRAM 188 of memory rank 111 has a mode register 140*b* and 140*j* as depicted). A similar structure is then again depicted for additional memory ranks, such as in the embodiment shown, having memory rank 112 and memory rank 117, designated as secondary rank-7, again with each rank having multiple DRAM memories integrated therein, such as DRAM memories 187 of memory rank 117, and each DRAM memory again having its own integrated hardware logic 120, refresh time (e.g., 137 for secondary rank-7), and mode registers 140.

In one embodiment, hardware logic 120 triggers a refresh (e.g., a memory refresh, self refresh, word line boost operation, a read and immediately re-write operation, etc.) of the primary rank 110 at a first time (e.g., Time$_1$) depicted as refresh time-1 at element 130. In one embodiment, Time-1 at element 130 has a value of "0" meaning that the refresh of the primary rank will occur without delay, or with a staggered start time of "0."

Hardware logic 120 further triggers a non-overlapping staggered refresh cycle of each of the remaining memory ranks 111 through 117 designated as the secondary ranks (e.g., those not designated as a primary rank). The non-overlapping staggered refresh cycle consists of refreshing each of the secondary ranks 111 through 117 at a second one or more times (e.g., Time$_2$ through Time$_n$) corresponding to each of the respective memory ranks designated as the secondary ranks. Here, elements 131 through 137 correspond to the blocks labeled refresh time-2 through refresh time-n which in turn correspond to secondary ranks 111 through 117 (e.g., the first secondary rank, secondary rank-1 at element 111 corresponds to refresh time-2 at element 131 . . . and the last secondary rank, secondary rank-7 at element 117 corresponds to refresh time-n at element 137 as depicted within the DRAM memories 187 of memory rank 117). In one embodiment, hardware logic 120 is integrated within each of the respective DRAMs 187-189.

If the primary rank at refresh time-1 130 corresponds to a value of "0," then the first secondary rank to refresh must have a stagger value that is equal to the sum of the stagger value of the preceding rank, here the primary rank 110 plus at least the value of the time duration for the preceding rank. Take for example a total refresh interval (tREFI) of 7.8 µs (micro seconds). In an eight rank Memory Module 105 a refresh stagger may be calculated as 7.8 µs/8_ranks which equals 0.975 µs as an equally spaced stagger interval between each of the progressing ranks to prevent overlap. Thus, a stagger value programmed for memory rank 1 at element 111 (e.g., the first secondary rank which refreshes subsequent to rank 0 designated as the primary rank at element 110) is tSTAG1 (=0.975 µs), or "0.0 µs" for rank 0 at element 110 plus 0.975 µs which was ⅛th of tREFI at 7.8 µs. Accordingly, the stagger value programmed for rank 2 at element 112, which is the second secondary rank and the third rank in the series is thus tSTAG2 (tSTAG2=1.95 µs (0.975 µs*2)) and so on. Alternatively, the value can be computed by adding ⅛th of tREFI at 7.8 µs to the tSTAG of a preceding rank, to obtain the same stagger value. Other mechanisms for calculating the value are obviously available as well.

In the above example the time stagger values tSTAG were equally divided between the ranks but it is not necessary to do so as long as the refreshes do not overlap. The minimum value of tSTAG1 can be set as low as the duration of the time it takes to complete a refresh for a preceding rank, which will be a lesser value than the tREFI divided by the number of ranks to be refreshed in the non-overlapping memory refresh cycle. In other words, it is not necessary to equally divide larger tREFI or leave time periods between the ranks in which no refresh is occurring, although doing so is acceptable. The specific duration of a particular rank's refresh in any given Memory Module 105 is density dependent, however a typical value for a rank within a 4 Gbit Memory Module 105 is approximately ~300 ns (nanoseconds) or 0.3 µs. It should be noted that a subsequent non-overlapping memory refresh should be initiated or triggered after tREFI, the total refresh interval for the Memory Module 105.

In an embodiment, Memory Module 105 further includes multiple Mode Registers (MR) depicted as Mode Registers 140. In one embodiment, Mode Registers 140 are integrated within each of the respective DRAMs 187-189. In an embodiment, the primary rank 111 is identified as the primary rank based on a value stored within a Mode Register 140. For example, Mode Register 140a within each DRAM memory 189 is depicted as having value 145A stored within it, which can be used to designate whether or not any particular rank 110-117 is the primary rank. Mode register 140b within each of DRAMs 188 similarly contains a value 145B, for example, to designate any particular rank as a secondary rank.

In one embodiment, multiple Mode Registers 140 are utilized as Mode Register stagger bits to each store a respective stagger value for each of a corresponding one or more ranks of the remaining plurality of memory ranks designated the secondary ranks (111-117) within the Memory Module 105. For example, the refresh times, 131 through 137 corresponding to the secondary ranks 111 through 117 (e.g., Time$_2$ through Time$_n$ are derived from the respective stagger time value stored within each of the plurality of Mode Register stagger bits.

Mode Registers 140 may be used as mode register stagger bits, in which a corresponding value stored within each mode register 140 stores and corresponds to the stagger time for the respective secondary rank 111 through 117. Thus, the value stored in the stagger bits may represent the Refresh times depicted at Refresh Time-2 131 through Refresh Time-n 137. Such a value may also be supplied by the Mode Registers for Refresh Time-1 corresponding to the primary rank 110, and similarly have a stagger time value of "0." For example, in a particular embodiment, DIMM 105 includes Mode Registers 140a through 140p, in which Mode Registers 140a-h designates each DRAM device (e.g., 187-189) as either a primary or a secondary rank based upon a Mode Register Value 145 stored within mode registers 140a-h of the respective DRAMs 187-189, and in which Mode Registers 140i-p store a stagger time for each respective DRAM device (e.g., 187-189) designating either a refresh time, or a stagger value, or another value upon which to calculate the stagger delay. Thus, in such an embodiment, each distinct DRAM device (e.g., 187-189) has a first Mode Register 140 which designates its primary or secondary rank status, and a second Mode Register 140 which stores/holds the stagger delay, such as value which corresponds to Refresh Time$_1$ 130 through Refresh Time$_n$ 137.

In one embodiment, the non overlapping staggered refresh of each of the remaining plurality of memory ranks designated as the secondary ranks (111 through 117) at a second one or more times (131 through 137) comprises a total refresh cycle time period that is equally divided between the primary rank 110 and the memory ranks designated as the secondary ranks 111 through 117. In other embodiments, the times may not be divided equally, so long as the refreshes are established so as to not overlap with one another for the time duration of each rank's particular refresh. The non-overlapping refresh cycle is described in more detail below with respect to FIGS. 3 and 4.

In one embodiment, hardware logic 120 determines a respective Rank Identity for each of the memory ranks designated as the secondary ranks 111 through 117. In a particular embodiment, the Rank Identity for each of the secondary ranks 111 through 117 is read from, or computed, based on a value stored within one or more Mode Registers 140 that correspond to a particular rank. For example, secondary rank-1 at element 111 may correspond with Mode Register 140b of each DRAM within secondary rank-1 at element 111. In one embodiment, hardware logic 120 further calculates a respective stagger time value or refresh time (e.g., 131 through 137) for each of the respective memory ranks designated as the secondary ranks 111 through 117. In an embodiment, hardware logic 120 further triggers the non overlapping staggered refresh of each of the respective memory ranks designated as the secondary ranks 111 through 117 in accordance with the respective stagger time value or refresh time (131 through 137) calculated for each of the respective memory ranks designated as the secondary ranks 111 through 117.

In a particular embodiment, a Mode Register 140 internal to the Memory Module 105 (or internal to the DRAMs 187-189 of Memory Module 105) designates the Memory Module 105 as a primary or non-primary Memory Module 105. In such an embodiment, if Memory Module 105 is designated as primary based on a Mode Register 140, the Memory Module generates an ALERT signal to one or more non-primary Memory Modules communicatively interfaced with the Memory Module 105. For example, the ALERT signal may be triggered, generated, and sent via hardware logic 120.

Memory Module 105 is further depicted as having an External Voltage Vpp pin 150 through which it can source external power at a voltage greater than an operational voltage of the Memory Module 105. In the depicted embodiment, element 155 is a second External Voltage Vpp pin to source external power at a voltage greater than an operational voltage of the Memory Module 105.

Memory Module 105 is further shown as having a voltage regulator 170 to regulate the external power (sourced via Vpp pin 150 or 155) at the voltage greater than the operational voltage of the Memory Module 105 down to an operational voltage that is appropriate for, or corresponds with, the voltage requirements of the Memory Module 105.

For example, in one embodiment, the External Voltage Vpp pin (150 or 155) receives external power at 3.3 volts and the voltage regulator 170 regulates the external power from 3.3 volts down to the operational voltage for the Memory Module 105, commonly less than 3.0 volts. In an embodiment, the Memory Module may simultaneously source external power from a second External Voltage Vpp pin (e.g., 155) to source external power at the voltage greater than the operational voltage of the Memory Module. This external power is then regulated by voltage regulator 170 or by a second corresponding voltage regulator on the Memory Module.

In one embodiment the Memory Module 105 is a Double-Data-Rate 4 (DDR4) Memory Module or a DDR4 compatible or DDR4 compliant Memory Module and sources external voltage Vpp power in compliance with a corresponding DDR4 requirement.

Conventional memories commonly utilized internal charge pumps that pump up (boost, raise, increase) the voltage from a 1.5 volts (Vdd) to the desired voltage level for the word line boost or refresh. This internal voltage level depends on the particular Dynamic RAM (DRAM) process and varies across suppliers, but is generally in the range of 2.5-2.7 volts for DDR3. The charge pumps are in the range of 5-10% efficient and also take up a significant die size area for a Double-Data-Rate 3 DDR3 DRAM. The word line boost voltage is used during activation of a DRAM row (in other words for opening a DRAM page).

In many computing systems, 3.3 volts is readily available from the platform itself, and thus, in accordance with one embodiment, the 3.3 volts power is externally sourced via the external voltage Vpp pins 150 and 155 and then internally regulated from 3.3 volts to the desired voltage level (~2.5 volts) via voltage regulator 170.

Providing the external Vpp results in 3-4% DRAM die size savings as a result of elimination of conventionally required charge pumps. There is also significant power savings as charge pumps are only ~5% efficient. The power savings for Thermal Design Power (TDP) analysis is therefore in the range of 10%.

A dual in-line memory module (DIMM) connector of the Memory Module 105 can provide the Vpp power via external voltage Vpp pins 150 and 155 for internal word-line boost/refresh operations. A worst case scenario for Vpp power is when all ranks on the Memory Module 105 are being refreshed simultaneously. Therefore, if it is operationally feasible for a DRAM to refresh in such a way (e.g., all ranks refreshing simultaneously), sufficient power for this peak power scenario must be provided to negate the risk of data loss or corruption.

If a DRAM is managing its own refreshes, for example, without being directed by a processor or memory controller as to how to schedule and stagger such refreshes, then a potential risk of overlapping refreshes occurs where the refresh durations for respective ranks may begin to overlap each other. Even if a DRAM's self-refresh is started or initiated in a staggered fashion, it may nevertheless drift over time due to voltage and temperature irregularities and also due to the drift in a DRAM's oscillator. The longer period of time a DRAM is operating within a self refresh mode (e.g., such as a computer being put in to "sleep" mode or "standby" mode, but not actually powered off or completely "shut down") the greater the risk of refresh time drift, and thus, the more likely it is that a DRAM will require a higher peak power moment during any given refresh.

Take for example a ~30 mA current requirement per memory device. If there are 8 memory ranks with 18 memory devices per each memory rank, then the maximum "worst case" current requirement is 8_ranks*18_devices*30 mA which equals 4320 mA or 4.32 A as a worst case "peak power" scenario. This "peak power" requirement will require six dedicated external voltage Vpp pins on the DRAM's DIMM connector assuming 0.75 A available per pin for current carrying capability. The 4.32 A peak load may additionally require more sophisticated and complex voltage regulators as the current capability of existing 3.3V voltage regulators may not be sufficient.

By addressing the refresh time drift issue described above and further by establishing a mechanism through which a non-overlapping memory refresh can be implemented, the number of external voltage Vpp pins (150 and 155) required for a Memory Module 105 having the above power requirements of ~30 mA current requirement per memory device in which there are 8 memory ranks with 18 memory devices per each memory rank, can be reduced from 6 pins to only 2 external voltage Vpp pins (150 and 155). For example, if only one refresh can ever occur simultaneously, then the calculation is 1 memory rank with the same 18 memory devices requiring 30 mA each, or 1_rank*18_devices*30 mA which equals 540 mA or 0.54 A, which can be met by a single 0.75 A current carrying capability external voltage Vpp pins 150 or two pins (150 and 155) to reduce the per pin current load and provide redundancy.

Thus, in accordance with an embodiment of the invention, a Memory Module 105 includes exactly eight distinct memory ranks and further includes a first External Voltage Vpp pin 150 and second External Voltage Vpp pin 150 on the Memory Module 105, and no additional External Voltage Vpp pins besides the first and second pins (150 and 155) on the Memory Module. In this embodiment, the Memory Module 105 further does not include, or have integrated thereon, an internal charge pump to boost voltage to the operational voltage of the Memory Module 105, as the required power is completely sourced via the first and second external Voltage Vpp pins (150 and 155) on the Memory Module. In one embodiment, the External Voltage Vpp pin or pins (150 and/or 155) source external power for an internal word-line boost operation of the Memory Module at a voltage in excess of that required by the operation, and the voltage is regulated down to the voltage requirement for the word-line boost operation. Voltage regulator 170 can be integrated within each of the DRAM devices 187-189 on the DIMM 105, or alternatively, voltage regulator 170 can be integrated onto DIMM 105 separately from DRAM devices 187-189.

Other pins available within a DIMM module, which may be coupled with Memory Module 105 may provide additional functionality. For example, pin 160 is depicted as a data interface pin, and pin 165 is depicted as an external signal interface pin, for example, to receive external interrupts, commands, signals, etc. Obviously more pins could be provided on a DIMM module interfaced to such a Memory Module 105 (DIMMs having 72, 100, 144, 168, 200, 214, and 240 pins are all common), however, reducing the number of mandatory external voltage Vpp pins 150 and 155 can free up pins for other uses, such as data transfer via data interface pin(s) 160 or control and signal interface pin(s) 165.

In one embodiment, a total refresh cycle time period corresponding to $Time_1$ (via refresh time-1 130) through Time (refresh time-n 137) decreases or increases as a function of temperature within the Memory Module 105.

In one embodiment, temperature is determined by the Memory Module itself via a temperature sensor 175 which is internal to, or integrated on the Memory Module 105. The computation of refresh times may, for example, be performed via hardware logic 120. Hardware logic 120 may compute a total refresh cycle period for all ranks as a function of temperature, or may compute individual refresh times, durations, and thus stagger periods on a per rank basis as a function of temperature.

Figure 3:
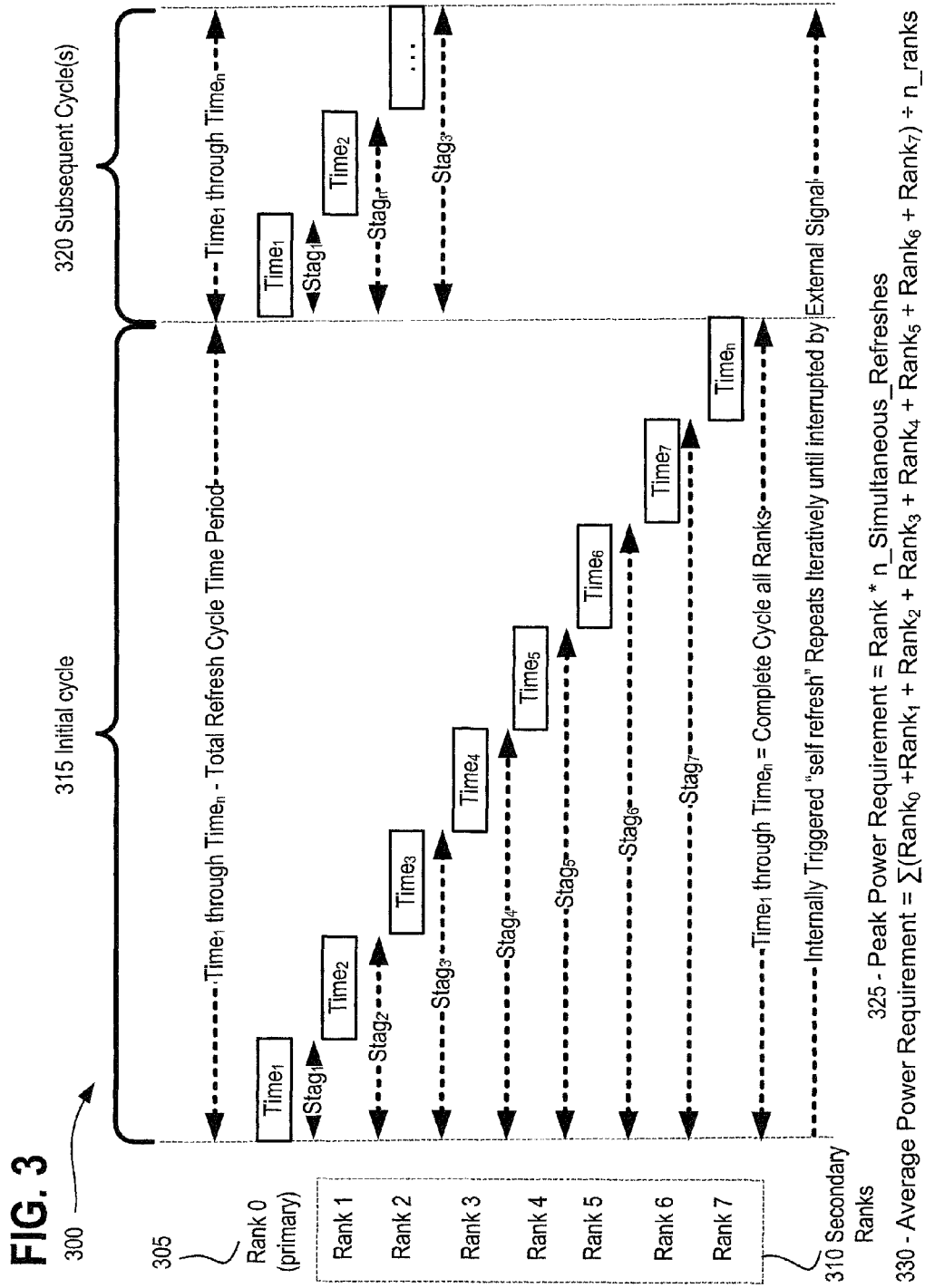
FIG. 3 illustrates a cycle flow diagram in accordance with embodiments of the present invention.

FIG. 3 illustrates a cycle flow diagram 300 in accordance with embodiments of the present invention. In particular, a first initial cycle 315 is depicted and a second subsequent cycle 320 is further depicted. Here, a memory rank "0" is designated as "primary" at element 305. Memory ranks "1" though "7" on an eight rank Memory Module are designated as secondary ranks at element 310. As can be seen within the initial cycle 315, each rank has, including the primary rank 305, has a corresponding time, such as $Time_1$ for primary rank 305 that corresponds to the refresh period for that particular rank and is at least as large as the minimum duration of a refresh for that particular rank. Also corresponding to each rank is a stagger time or delay, such as $Stag_1$ leading to the refresh at $Time_2$ of the first secondary rank at memory rank 1, and so on. Here, a total time of $Time_1$ through $Time_n$ corresponds to a complete cycle of all the ranks and is divided evenly between the ranks, however, even distribution is not necessary. Only a non-overlapping staggered refresh cycle is required. In the subsequent cycle or cycles 320, the same process is simply repeated either subsequent to an ALERT signal or without awaiting an ALERT signal trigger depending on the chosen implementation.

Using cycle flow 300, it is shown at element 325 that the peak power requirement for the depicted cycle flow is equal to the amount of power required for a single rank, multiplied by the number of simultaneous refreshes permitted, which is, of course, one. Thus the peak power requirement is equal simply to the amount of power for a single rank's refresh. The Average peak power requirement is shown at element 330, and is equal to the sum of the power requirements for each rank in a Memory Module then divided by the number of ranks in the Memory Module. Thus, in accordance with cycle flow 300, the "peak power" requirement and the "average power requirement" should be equal to each other.

Figure 4:
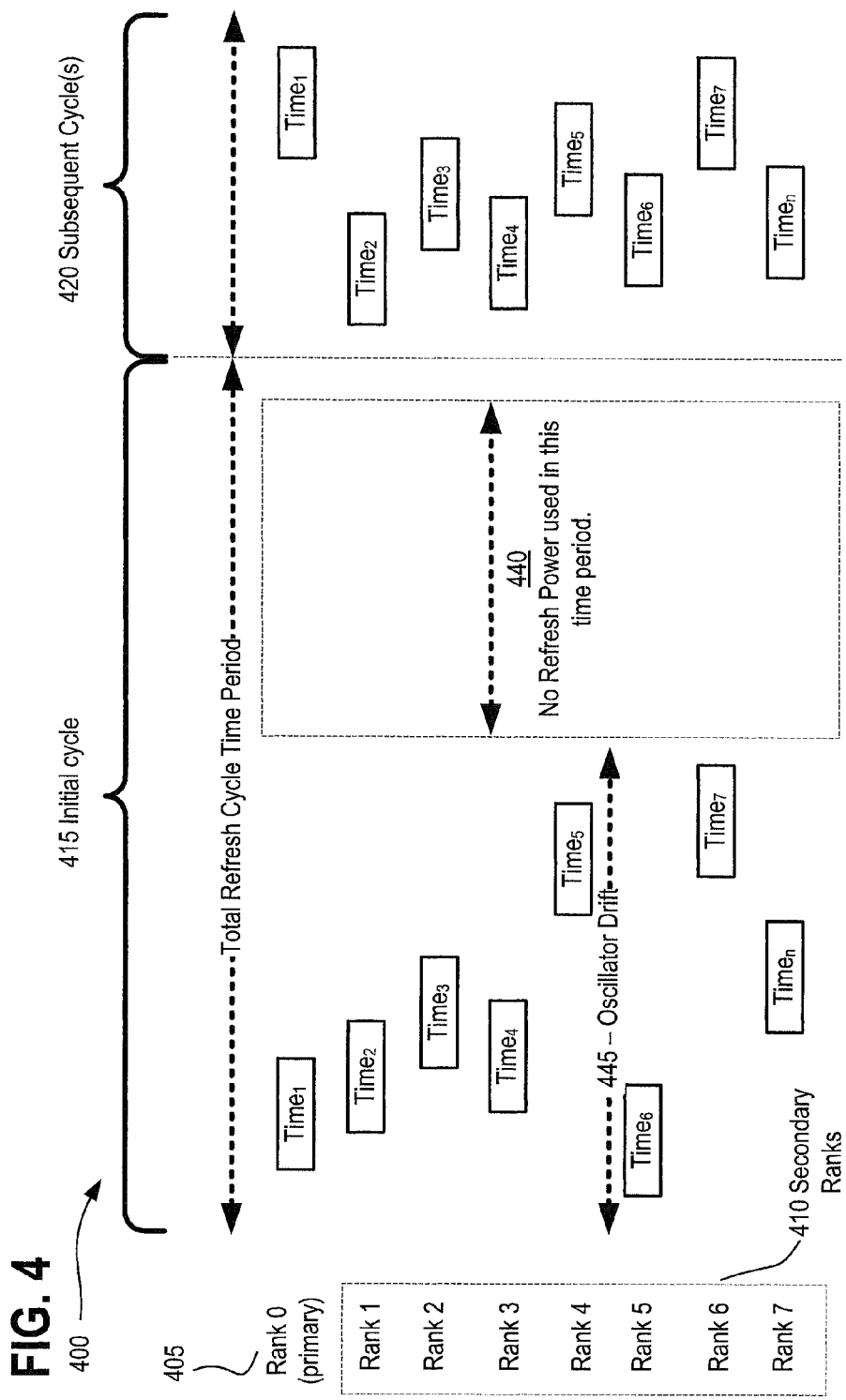
FIG. 4 illustrates an alternative cycle flow diagram.

FIG. 4 is illustrates an alternative cycle flow 400 diagram for implementing memory refreshes in which time drift induced by variance in voltage, temperature, or oscillator inaccuracy has allowed memory refreshes of distinct memory ranks to become overlapped.

In particular, a first initial cycle 415 is depicted and a second subsequent cycle 420 is further depicted. As before, memory rank "0" is designated as "primary" at element 405. Memory ranks "1" though "7" on an eight rank Memory Module are designated as secondary ranks at element 410. As can be seen within the initial cycle 415, each rank has, including the primary rank 405, a corresponding time, such as $Time_1$ for primary rank 405 that corresponds to the refresh period for that particular rank and is at least as large as the minimum duration of a refresh for that particular rank. However, due to oscillator drift at 445, or other similar problems that induce drift, several of the memory ranks' refresh time periods over lap, and then no memory refreshes occur during a subsequent period designated by element 440. Subsequent cycle 420 depicts a similar occurrence.

Accordingly, at element 425, the "peak power requirement" for cycle flow 400 is the sum of the power requirements for each rank present in the Memory Module. Since it is theoretically feasible that all ranks' refreshes could occur simultaneously, the peak power must accommodate a refresh moment in which every rank simultaneously demands refresh power. The average peak power requirement for cycle flow 400 is shown at element 430, and is identical to the average peak power requirement of cycle flow 300, which is equal to the sum of the power requirements for each rank in a Memory Module then divided by the number of ranks in the Memory Module. Conversely however, the "average power requirement" 430 and the "peak power requirement" 425 of cycle flow 400 are not equal, whereas the two corresponding values of cycle flow 300 are equal.

Figure 5:
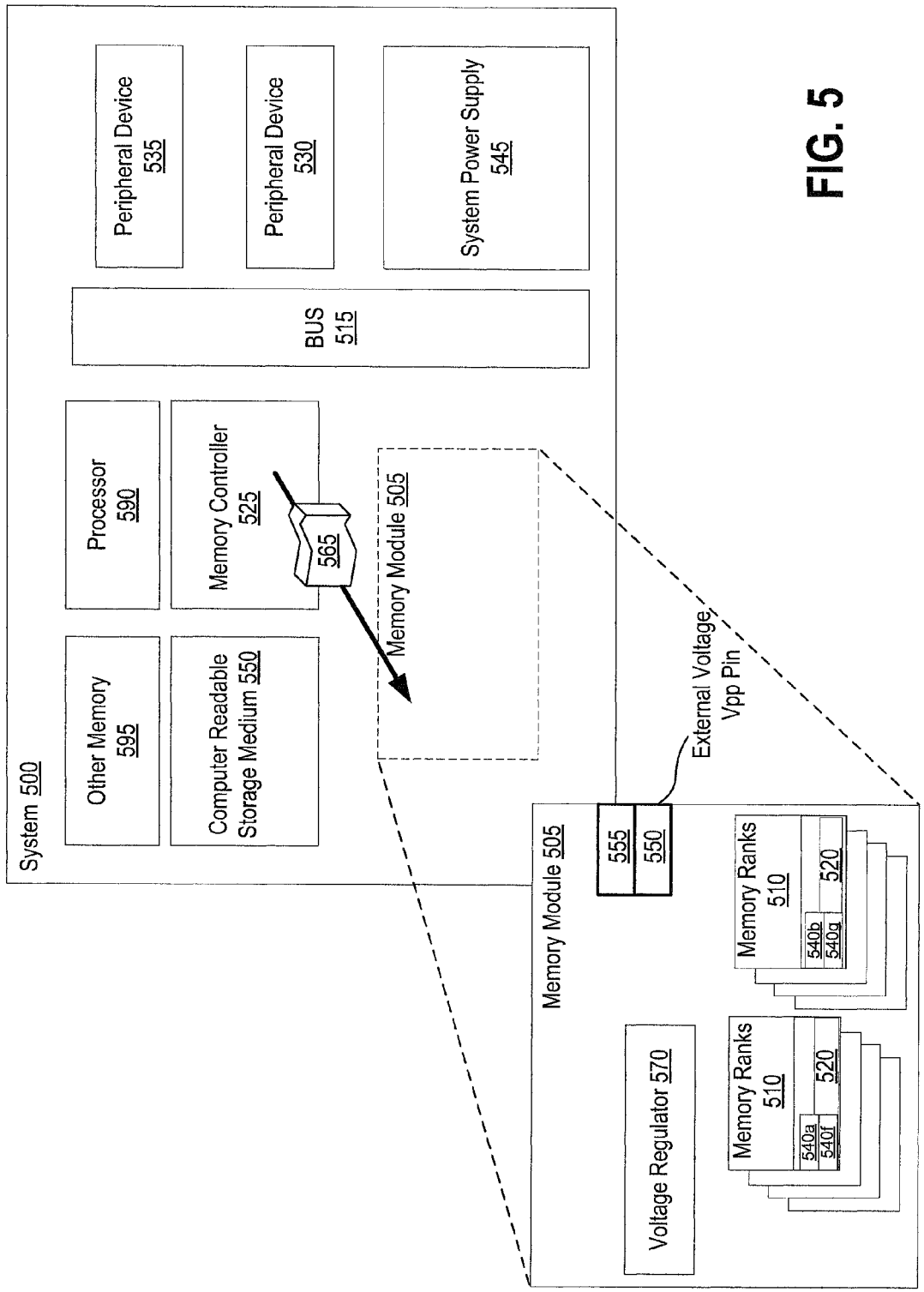
FIG. 5 is a diagrammatic representation of a system in which an embodiment of the Memory Module or Dual In-Line Memory Module (DIMM) may operate.

FIG. 5 shows a diagrammatic representation of a system 500 in which an embodiment of the Memory Module may operate, be installed, integrated, or configured.

System 500 includes other memory 595, processor 590, a computer readable storage medium at element 550, a memory controller 525 which is external to and distinct from a Memory Module 505 implemented within the system 500. System 500 further includes bus 515, peripheral devices 530 and 535, and finally a system power supply at element 545. The other memory 595 (e.g., non-volatile memory, static memory, cache memory, etc.) may store instructions to be executed and processor 590 may execute such instructions on behalf of the system 500. Bus 515 may be utilized to transfer, signals, and data within system 500 among a plurality of peripheral devices (e.g., 530 and 535) communicably interfaced with the bus 515, including to, from, and between Memory Module 505 and processor 590, memory controller 525, or other memory 595. Memory controller 525 is further depicted as originating and sending a message 565, such as an interrupt, a memory command, a request to enter a low power mode, etc., to the Memory Module 505. Such a message 565 is originated external to the Memory Module 505 and may, for example, be communicated via bus 515.

Distinct within system 500, Memory Module 505 further includes several integrated elements, including two external voltage Vpp pins 550 and 555, eight memory ranks 510, hardware logic 520 which respectively integrated within each DRAM memory of each memory rank 510, Mode Registers 540 integrated within each DRAM memory of each memory rank 510, and a voltage regulator 570 which is integrated into the Memory Module 505 itself. Memory Module 505 may be integrated with system 500 at manufacture, or produced separately and installed later, depending on the selected embodiment to be practiced, and consistent with that which is taught herein.

Accordingly, in one embodiment, such a system includes a bus 515, a computer-readable storage medium 550 communicatively interfaced with the bus 515, a central processing unit 590 communicatively interfaced with the bus 515, a system power supply 545 to provide operational power to the system 500, and a Memory Module 505 communicatively interfaced with the bus 515 and electrically coupled with the system power supply 545. In such an embodiment, the Memory Module 505 itself includes an External Voltage Vpp pin 550 to source external power from the system power supply 545 at a voltage greater than an operational voltage of the Memory Module 505, a voltage regulator 570 to regulate the external power at the voltage greater than the operational voltage of the operational voltage of the Memory Module 505 down to the operational voltage of the Memory Module 505, a plurality of memory ranks 510 in which a first rank of the plurality of memory ranks 510 is designated as a primary rank within the Memory Module 505 and a second one or more ranks of the remaining plurality of memory ranks 510 are designated as secondary ranks. In this embodiment, hardware logic 520 internal to the Memory Module 505 triggers a refresh of the primary rank at a first time ($Time_1$), and the hardware logic 520 further triggers a non overlapping staggered refresh of each of the remaining plurality of memory ranks 510 designated as the secondary ranks at a second one or more times ($Time_2$ through $Time_n$) corresponding to each of the respective memory ranks 510 which are designated as the secondary ranks.

Figure 6:
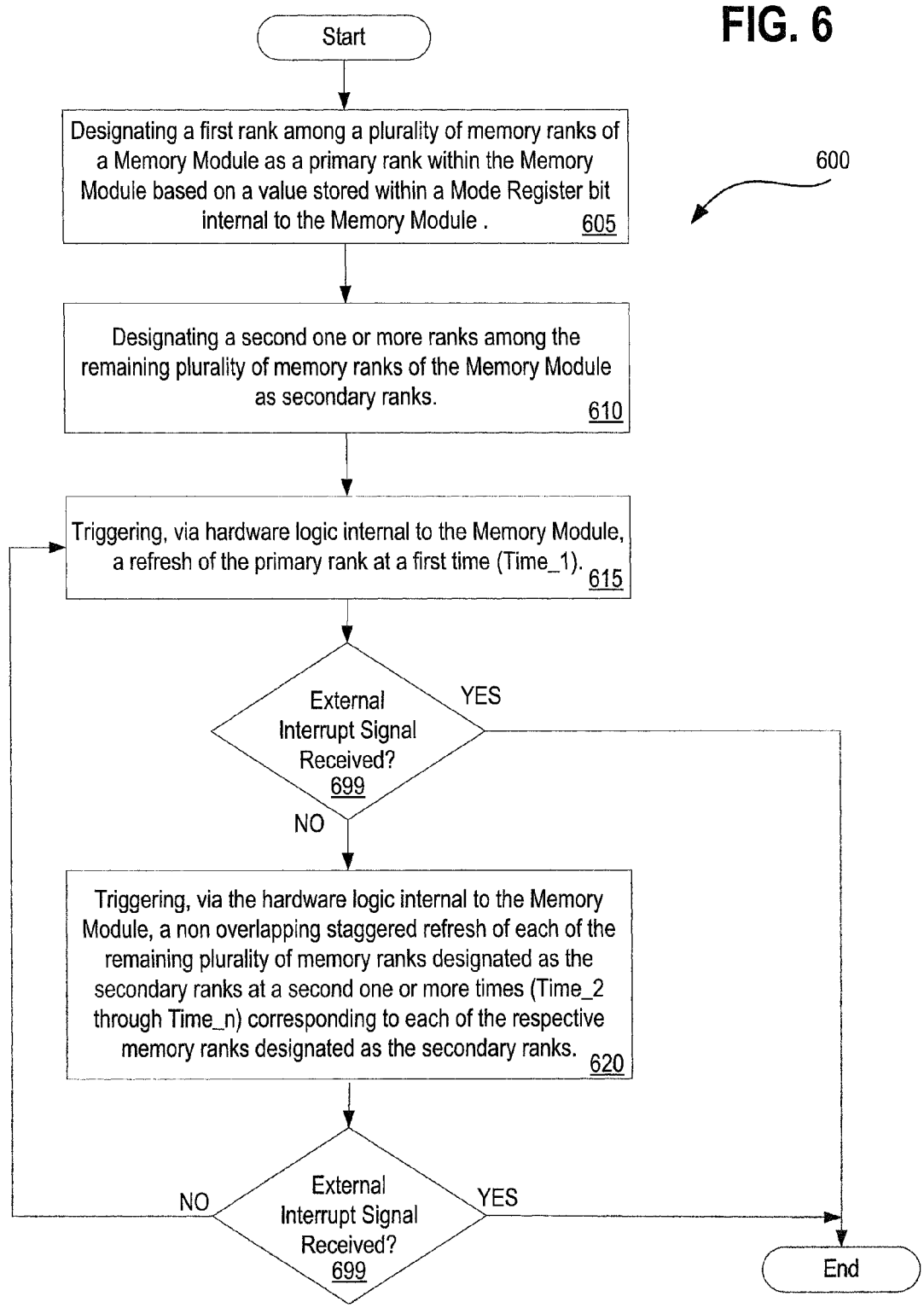
FIG. 6 is a flow diagram illustrating a method for memory self refreshes in accordance with one embodiment of the present invention.

FIG. 6 is a flow diagram 600 illustrating a method for memory refreshes in accordance with one embodiment of the present invention. Method 600 may be performed by processing logic that may include hardware (e.g., circuitry, dedicated logic, programmable logic, microcode, etc.), software (e.g., instructions run on a processing device to perform hardware simulation), or a combination thereof. In one embodiment, method 600 is performed by hardware logic, such as the hardware logic depicted at element 120 FIG. 1 or hardware logic 520 as depicted in FIG. 5. In an alternative embodiment, method 600 is performed in conjunction with a system, such as system 500 working in conjunction with Memory Module 505, as depicted in FIG. 5. FIG. 600 may also be implemented by a hardware emulator, in which a processor and corresponding software instructions cause the operations to be performed.

Method 600 begins with processing logic designating a first rank among a plurality of memory ranks of a Dynamic Random Access Memories (DRAMs) as a primary rank within the Memory Module based on a value stored within a Mode Register internal to the Memory Module (block 605). At block 610, processing logic designates a second one or more ranks among the remaining plurality of memory ranks of the Memory Module as secondary ranks.

At block 615, processing logic triggers a refresh of the primary rank at a first time (Time_1).

Subsequent to block 615, decision block 699 determines whether or not an external interrupt signal has been received. If "yes," an external interrupt signal has been received, then method 600 ends. If "no," an external interrupt signal has not been received, then method 600 proceeds to block 620.

At block 620, processing logic triggers a non overlapping staggered refresh of each of the remaining plurality of memory ranks designated as the secondary ranks at a second one or more times (Time_2 through Time_n) corresponding to each of the respective memory ranks designated as the secondary ranks.

Subsequent to block 620, decision block 699 again determines whether or not an external interrupt signal has been received. If "yes," an external interrupt signal has been received, then method 600 ends. If "no," an external interrupt signal has not been received, then method 600 proceeds to block 615.

The external interrupt signal discussed above may originate from, for example, an external memory controller attempting to regain control of the Memory Module and thus terminate the Memory Module's self refresh mechanism, for example, by sending an SRX command to all ranks (e.g., externally originated signal/interrupt 565 originating from memory controller 525 as depicted by FIG. 5). The Memory Module can be configured to accept a single instruction from an external memory controller to, for example, enter a low power mode, ignore clock, and implement internal self refresh mode, or may be configured accept multiple simultaneous commands which are then simply translated into a request to enter the described non-overlapping memory refresh cycling mechanism, regardless of whether or not the external memory controller was attempting to establish a staggered or simultaneous or mixed refresh scheme. In this way, it is possible to allow the external memory controller trigger RAM's non-overlapping memory refresh mechanism in a single clock cycle of the external system, without the need to issue refresh commands individually to each of a plurality of ranks within a Memory Module over the course of multiple subsequent clock cycles, in order to appropriately stagger such ranks. The external memory controller also need not continuously monitor the ranks to ensure that they do not drift into overlap. In computing time, the savings of such a delay can be significant, and the offloading of responsibility from an external memory controller to a self contained Memory Module itself is also a significant advancement.

In one some embodiments, an ALERT signal is used to trigger each cycle of the non-overlapping memory refresh for the secondary ranks, which will monitor for such an ALERT signal from a primary rank. In other embodiments, an ALERT signal is not used, and thus, once started, the non-overlapping memory refresh cycle simply continues indefinitely until interrupted, without the secondary ranks awaiting an ALERT signal from a primary rank during each iteration.

FIG. 7 illustrates a diagrammatic representation of a machine 700 in the exemplary form of a computer system, in accordance with one embodiment of the present invention, within which a set of instructions, for causing the machine 700 to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, computing system, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 700 includes a processor 702, a DDR4 Memory Module 704, other memory 734 (e.g., read-only memory (ROM), flash memory, dynamic random access memory (DRAM) such as synchronous DRAM (SDRAM) or Rambus DRAM (RDRAM), etc., static memory such as flash memory, static random access memory (SRAM), etc.), and a secondary memory 718 (e.g., a data storage device), which communicate with each other via a bus 730. DDR4 Memory Module 704 includes multiple memory ranks 724 in which one is designated a primary rank and the remainder designated as secondary ranks. DDR4 Memory Module 704 further includes hardware logic 723 to perform the methodologies discussed herein.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations and steps discussed herein.

The computer system 700 may further include a network interface card 708. The computer system 700 also may include a user interface 710 (such as a video display unit, a liquid crystal display (LCD), or a cathode ray tube (CRT)), an alphanumeric input device 712 (e.g., a keyboard), a cursor control device 714 (e.g., a mouse), and a signal generation device 716 (e.g., a speaker). The computer system 700 includes a power supply 736 to provide system power to the various peripheral devices and to DDR4 Memory Module 704.

The secondary memory 718 may include a machine-readable storage medium (or more specifically a computer-readable storage medium) 731 on which is stored one or more sets of instructions (e.g., software 722) embodying any one or more of the methodologies or functions described herein. The software 722 may be transmitted or received over a network 720 via the network interface device 708.

It is to be understood that the above description is intended to be illustrative, and not restrictive. Many other embodiments will be apparent to those of skill in the art upon reading and understanding the above description. The scope of the invention is therefore determined in reference to the appended claims, along with the full scope of equivalents to which such claims are entitled.

What is claimed is:

1. A Memory Module comprising:
a plurality of memory ranks including a primary rank and one or more secondary ranks;
hardware logic internal to the Memory Module coupled with the plurality of memory ranks to trigger a refresh of the primary rank at a first time ($Time_1$), and to trigger a non-overlapping staggered refresh of each of the secondary ranks at a second one or more times ($Time_2$ through $Time_n$) corresponding to each of the respective memory ranks designated as the secondary ranks;
a communications interface to one or more other non-primary Memory Modules; and
a Mode Register internal to the Memory Module to designate the Memory Module as a primary or non-primary Memory Module, wherein the Memory Module to generate an ALERT signal to the one or more other non-primary Memory Modules communicatively interfaced with the Memory Module when the Memory Module is designated as the primary Memory Module.

2. The memory module of claim 1, wherein the hardware logic internal to the Memory Module coupled with the plurality of memory ranks is integrated within a plurality of Dynamic Random Access Memories (DRAMs) of the first rank and the second one or more ranks, wherein the hardware logic of the plurality of DRAMs associated with the primary rank triggers the refresh of the primary rank at the first time ($Time_1$) and wherein the hardware logic of the plurality of DRAMs associated with the secondary ranks triggers the non-overlapping staggered refresh of each of the remaining plurality of memory ranks designated as the secondary ranks at the second one or more times ($Time_2$ through $Time_n$).

3. The Memory Module of claim 1, wherein the primary rank and each of the one or more secondary ranks comprise a plurality of Dynamic Random Access Memories (DRAMs), and wherein each DRAM comprises the Mode Register, and wherein the primary rank is identified as the primary rank based on a value stored within the Mode Registers within the DRAMs of the primary rank, and wherein the one or more secondary ranks are identified as secondary ranks based on a value stored within the Mode Registers within the DRAMs of the respective one or more secondary ranks.

4. The Memory Module of claim 3, further comprising:
a plurality of Mode Register stagger bits to each store a respective stagger value for each of a corresponding one or more ranks of the remaining plurality of memory ranks designated the secondary ranks within the Memory Module, wherein the $Time_2$ through $Time_n$ is derived from the respective stagger time value stored within each of the plurality of Mode Register stagger bits.

5. The Memory Module of claim 4, wherein the refresh of the primary rank at the first time ($Time_1$) and non-overlapping staggered refresh of each of the remaining plurality of memory ranks designated as the secondary ranks at the second one or more times ($Time_2$ through $Time_n$) comprises a total refresh cycle time period ($Time_1$ through $Time_n$) that is equally divided between the primary rank and the memory ranks designated as the secondary ranks.

6. The Memory Module of claim 1, wherein the non-overlapping staggered refresh of each of the remaining plurality of memory ranks designated as the secondary ranks at a second one or more times ($Time_2$ through $Time_n$) comprises the hardware logic to:
determine a respective Rank Identity for each of the memory ranks designated as the secondary ranks,
calculate a respective stagger time value for each of the respective memory ranks designated as the secondary ranks; and
trigger the non-overlapping staggered refresh of each of the respective memory ranks designated as the secondary ranks in accordance with the respective stagger time value calculated for each of the respective memory ranks designated as the secondary ranks.

7. The Memory Module of claim 1, further comprising:
an External Voltage Vpp pin to source external power at a voltage greater than an operational voltage of the Memory Module;
a voltage regulator to regulate the external power at the voltage greater than the operational voltage of the operational voltage of the Memory Module down to the operational voltage of the Memory Module;

wherein the External Voltage Vpp pin receives external power at 3.3 volts; and wherein the voltage regulator to regulate the external power from 3.3 volts down to the operational voltage of less than 3.0 volts.

8. The Memory Module of claim 7, further comprising:

a second External Voltage Vpp pin to source external power at the voltage greater than the operational voltage of the Memory Module;

wherein the plurality of memory ranks comprises eight distinct memory ranks;

wherein the first External Voltage Vpp pin and second External Voltage Vpp pin of the Memory Module comprise the only External Voltage Vpp pins on the Memory Module; and wherein the Memory Module does not comprise an internal charge pump to boost voltage to the operational voltage of the Memory Module.

9. The Memory Module of claim 7, wherein the External Voltage Vpp pin to source the external power for an internal word-line boost operation of the Memory Module.

10. The Memory Module of claim 1, wherein the hardware logic internal to the Memory Module iteratively re-triggers the refresh of the primary rank at a first time ($Time_1$) and the non-overlapping staggered refresh of each of the remaining plurality of memory ranks designated as the secondary ranks at the second one or more times ($Time_2$ through $Time_n$) as an ongoing indefinite loop until interrupted by a signal originating external to the Memory Module.

11. The Memory Module of claim 1, wherein a total refresh cycle time period corresponding to $Time_1$ through $Time_n$ changes as a function of a temperature of the Memory Module.

12. The Memory Module of claim 1, wherein the Memory Module comprises a Double-Data-Rate 4 (DDR4) Memory Module.

13. A system comprising:

a bus;

a computer-readable storage medium communicatively interfaced with the bus;

a central processing unit communicatively interfaced with the bus;

a system power supply to provide operational power to the system; and a Memory Module communicatively interfaced with the bus and electrically coupled with the system power supply, wherein the Memory Module comprises:

an External Voltage Vpp pin to source external power from the system power supply at a voltage greater than an operational voltage of the Memory Module, a voltage regulator to regulate the external power at the voltage greater than the operational voltage of the operational voltage of the Memory Module down to the operational voltage of the Memory Module, a plurality of memory ranks including a primary rank and one or more secondary ranks, and hardware logic internal to the Memory Module coupled with the plurality of memory ranks to trigger a refresh of the primary rank at a first time ($Time_1$), and to trigger a non overlapping staggered refresh of each of the secondary ranks at a second one or more times ($Time_2$ through $Time_n$) corresponding to each of the respective memory ranks designated as the secondary ranks, a communications interface to one or more other non-primary Memory Modules, and a Mode Register internal to the Memory Module to designate the Memory Module as a primary or non-primary Memory Module, wherein the Memory Module to generate an ALERT signal to the one or more other non-primary Memory Modules communicatively interfaced with the Memory Module when the Memory Module is designated as the primary Memory Module.

14. The system of claim 13, wherein the hardware logic internal to the Memory Module coupled with the plurality of memory ranks is integrated within a plurality of Dynamic Random Access Memories (DRAMs) of the first rank and the second one or more ranks, wherein the hardware logic of the plurality of DRAMs associated with the primary rank triggers the refresh of the primary rank at the first time ($Time_1$) and wherein the hardware logic of the plurality of DRAMs associated with the secondary ranks triggers the non-overlapping staggered refresh of each of the remaining plurality of memory ranks designated as the secondary ranks at the second one or more times ($Time_2$ through $Time_n$).

15. The system of claim 13, wherein the primary rank and each of the one or more secondary ranks comprise a plurality of Dynamic Random Access Memories (DRAMs), and wherein each DRAM comprises the Mode Register, and wherein the primary rank is identified as the primary rank based on a value stored within the Mode Registers within the DRAMs of the primary rank, and wherein the one or more secondary ranks are identified as secondary ranks based on a value stored within the Mode Registers within the DRAMs of the respective one or more secondary ranks.

16. The system of claim 13, wherein the Memory Module further comprises:

the Mode Register internal to the Memory Module, wherein the primary rank is identified as the primary rank based on a value stored within the Mode Register; and a plurality of Mode Register stagger bits to each store a respective stagger value for each of a corresponding one or more ranks of the remaining plurality of memory ranks designated the secondary ranks within the Memory Module, wherein the $Time_2$ through $Time_n$ is derived from the respective stagger time value stored within each of the plurality of Mode Register stagger bits.

17. The system of claim 13, wherein the Memory Module comprises a Double-Data-Rate 4 (DDR4) Memory Module.

18. The system of claim 17, wherein a total refresh cycle time period for the Memory Module corresponds to $Time_1$ through $Time_n$, and wherein the total refresh cycle time period changes as a function of a temperature of the Memory Module, wherein the temperature is derived from a temperature sensor internal to the DDR4 Memory Module of the system.

19. A method comprising:

designating a first rank among a plurality of memory ranks of a Memory Module as a primary rank and a second one or more ranks as secondary ranks;

triggering, via hardware logic internal to the Memory Module coupled with the plurality of memory ranks, a refresh of the primary rank at a first time ($Time_1$);

triggering a non-overlapping staggered refresh of each of the secondary ranks at a second one or more times ($Time_2$ through $Time_n$) corresponding to each of the respective memory ranks designated as the secondary ranks;

wherein a communications interface is to interface with one or more other non-primary Memory Modules; and designating, via a Mode Register internal to the Memory Module, the Memory Module as the primary or non-primary Memory Module, wherein the Memory Module generates an ALERT signal to the one or more other non-primary Memory Modules communicatively interfaced with the Memory Module when the Memory Module is designated as the primary Memory Module.

20. The method of claim 19, wherein the hardware logic internal to the Memory Module coupled with the plurality of memory ranks is integrated within a plurality of Dynamic Random Access Memories (DRAMs) of the first rank and the second one or more ranks, wherein the hardware logic of the plurality of DRAMs associated with the primary rank triggers the refresh of the primary rank at the first time ($Time_1$) and wherein the hardware logic of the plurality of DRAMs associated with the secondary ranks triggers the non-overlapping staggered refresh of each of the remaining plurality of memory ranks designated as the secondary ranks at the second one or more times ($Time_2$ through $Time_n$).

21. The method of claim 19, wherein the primary rank and each of the one or more secondary ranks comprise a plurality of Dynamic Random Access Memories (DRAMs), and wherein each DRAM comprises the Mode Register, and wherein the primary rank is identified as the primary rank based on a value stored within the Mode Registers within the DRAMs of the primary rank, and wherein the one or more secondary ranks are identified as secondary ranks based on a value stored within the Mode Registers within the DRAMs of the respective one or more secondary ranks.

22. The method of claim 19, wherein the Memory Module comprises a Double-Data-Rate 4 (DDR4) Memory Module.

23. The method of claim 19, wherein the method further comprises iteratively repeating the following operations until interrupted by a signal originating external to the Memory Module:

triggering the refresh of the primary rank at the first time ($Time_1$); and triggering the non-overlapping staggered refresh of each of the remaining plurality of memory ranks designated as the secondary ranks at the second one or more times ($Time_2$ through $Time_n$) corresponding to each of the respective memory ranks designated as the secondary ranks.

* * * * *